(12) United States Patent
Platzgummer

(10) Patent No.: US 7,763,851 B2
(45) Date of Patent: Jul. 27, 2010

(54) PARTICLE-BEAM APPARATUS WITH IMPROVED WIEN-TYPE FILTER

(75) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 308 days.

(21) Appl. No.: 11/951,543

(22) Filed: Dec. 6, 2007

(65) Prior Publication Data

US 2008/0149846 A1 Jun. 26, 2008

(30) Foreign Application Priority Data

Dec. 22, 2006 (AT) .................................... 2141/06

(51) Int. Cl.
*G21K 1/08* (2006.01)
*G01N 23/00* (2006.01)
(52) U.S. Cl. ................. 250/310; 250/306; 250/307; 250/309; 250/311; 250/398
(58) Field of Classification Search .......... 250/369 ML, 250/492.23, 369 R, 310, 398
See application file for complete search history.

(56) References Cited

U.S. PATENT DOCUMENTS

| 4,697,086 A | 9/1987 | Ishitani et al. |
| 4,894,549 A | 1/1990 | Stengl |
| 4,985,634 A | 1/1991 | Stengl et al. |
| 6,593,152 B2 * | 7/2003 | Nakasuji et al. ............... 438/14 |
| 6,768,125 B2 | 7/2004 | Platzgummer et al. |
| 6,943,349 B2 * | 9/2005 | Adamec et al. ................. 850/9 |
| 7,095,023 B2 * | 8/2006 | Nagano et al. ............... 250/310 |
| 2003/0168606 A1 * | 9/2003 | Adamec et al. ......... 250/396 R |
| 2005/0012052 A1 | 1/2005 | Platzgummer et al. |
| 2005/0139789 A1 * | 6/2005 | Nagano et al. ......... 250/492.23 |
| 2008/0054184 A1 * | 3/2008 | Knippelmeyer et al. ..... 250/396 ML |

FOREIGN PATENT DOCUMENTS

| EP | 0 281 549 | 9/1988 |
| EP | 1 505 630 A2 | 2/2005 |

OTHER PUBLICATIONS

Dutch Search Report for Application No. NO 136003.

* cited by examiner

*Primary Examiner*—Robert Kim
*Assistant Examiner*—Johnnie L Smith
(74) *Attorney, Agent, or Firm*—RatnerPrestia

(57) ABSTRACT

In a particle-beam apparatus for irradiating a target, a pattern defined in a pattern definer is projected onto the target through a projection system by a beam of energetic electrically charged particles of, largely, a species of a nominal mass having a nominal kinetic energy. To generate the beam, a particle source, a velocity-dependent deflector and an illumination optics system are provided. The velocity-dependent deflector includes a transversal dipole electrical field and/or a transversal dipole magnetic field, which act upon the particles so as to causing a deviation of the path of the particles with regard to the paths of the nominal species which is dependent on the velocity of the particles. A delimiter is provided as a component of the pattern definer or, preferably, the projection system, serving to remove particles whose paths are deviating from the nominal path.

9 Claims, 3 Drawing Sheets

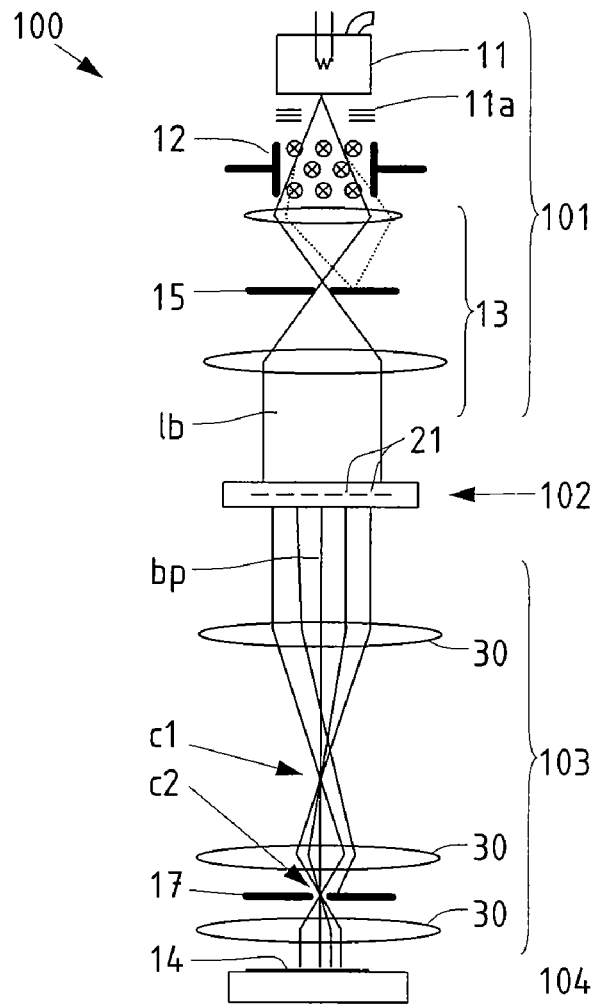
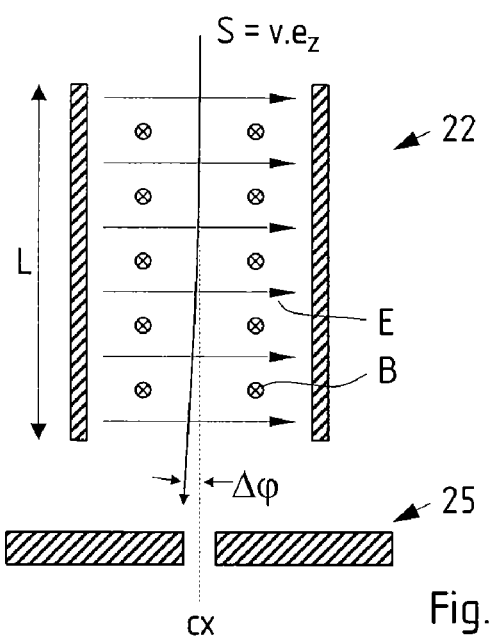
Fig. 1
Fig. 2

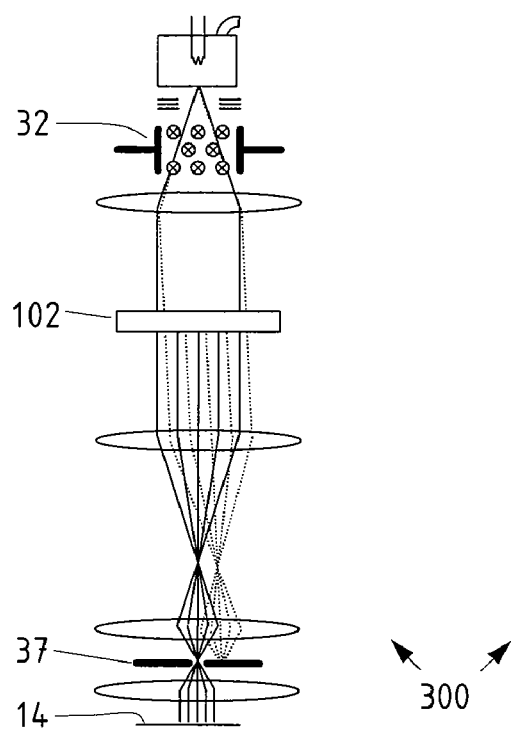
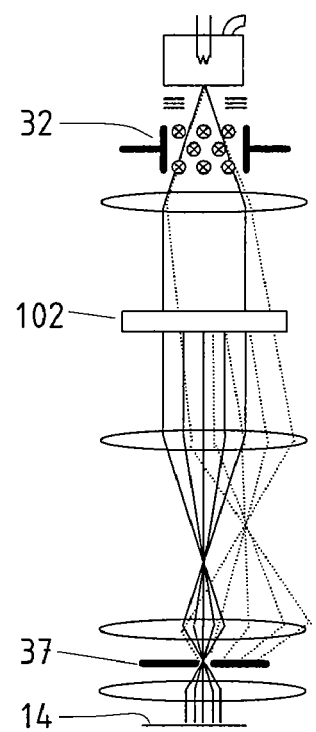
Fig. 3            Fig. 4
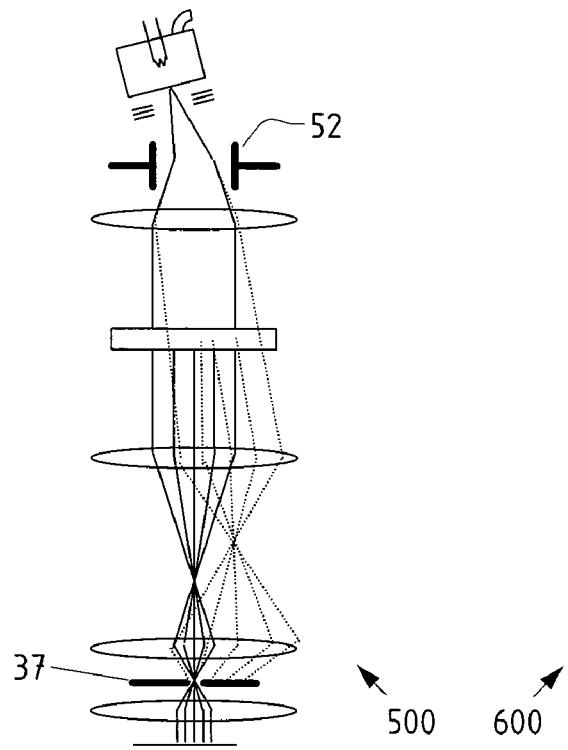
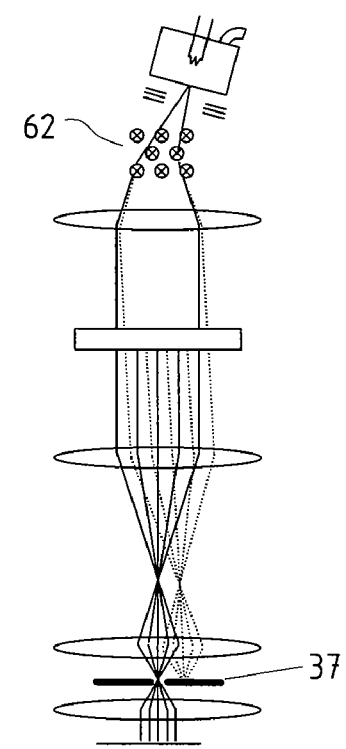
Fig. 5            Fig. 6

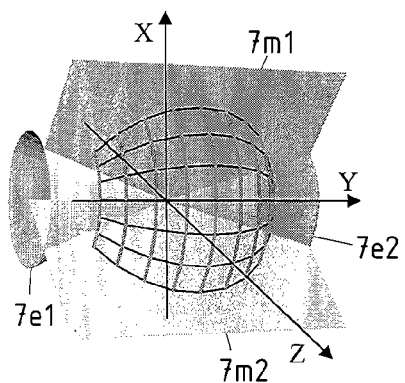
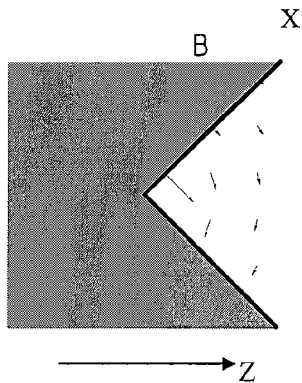
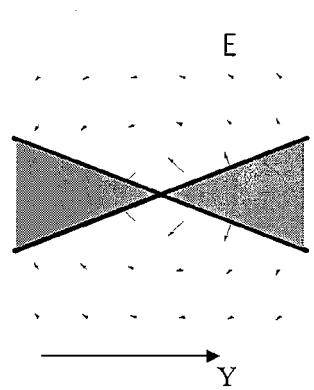
Fig. 7a     Fig. 7b     Fig. 7c
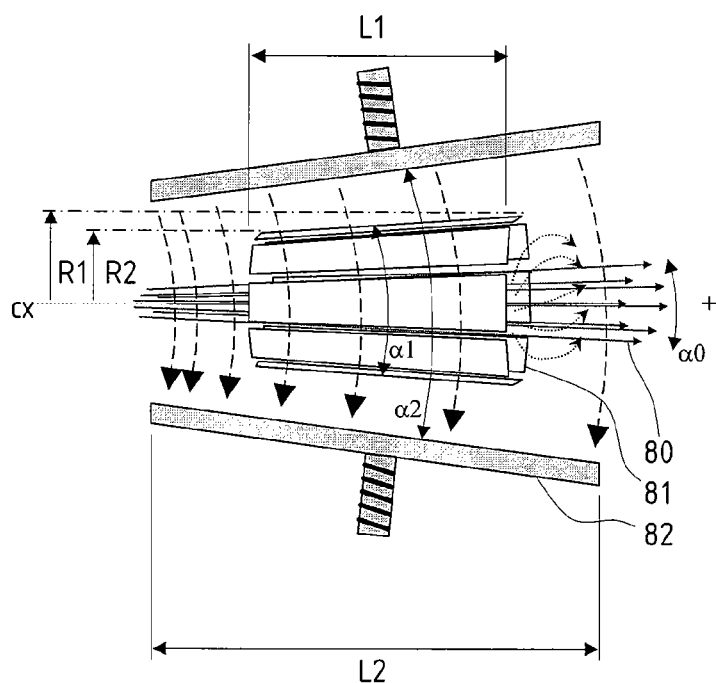
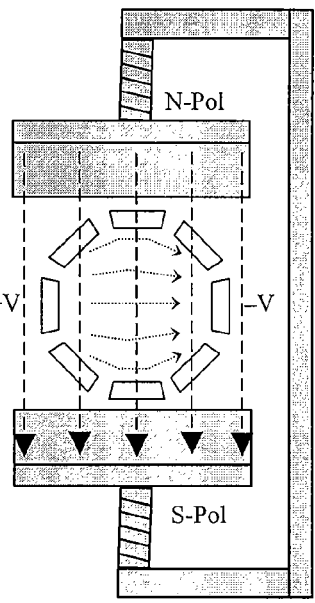
Fig. 8     Fig. 9

PARTICLE-BEAM APPARATUS WITH IMPROVED WIEN-TYPE FILTER

FIELD OF THE INVENTION AND DESCRIPTION OF PRIOR ART

The invention relates to improvements on a particle-beam apparatus for irradiating a target. The apparatus comprises: a particle source adapted to generate a beam of energetic electrically charged particles the majority of which conform to a nominal species of a nominal mass having a nominal kinetic energy, but some of the particles may be impurities; an illumination optics system for forming said beam into an illuminating beam which is substantially tele/homocentric along an optical path; a pattern definition means located after the illumination optics system as seen along the direction of the beam, which comprises a plurality of apertures adapted to form the illuminating beam into a plurality of beamlets; a projection system configured to form the beamlets emerging from the pattern definition means into a final image of the apertures; and a target stage means adapted to position a target at the position of said final image.

BACKGROUND OF THE INVENTION

Particle-beam apparatus of this kind are used in semiconductor production and microstructuring applications. In particular direct patterning by ion-beam irradiation is a promising concept for the future industrial fabrication of nano-scale devices with high resolutions, in particular the 32 nm and 22 nm nodes and below. The pattern definition (PD) device may be, for instance, a stencil mask or, preferably, a programmable multi-aperture device. The implementation of a multi-beam projection optical system based on a programmable multi-aperture plate allows a significant improvement of the achievable productivity in comparison with focused single beam systems. The reasons for the improved productivity are, firstly, the parallelism of the process using a plurality of beams and, secondly, the increased current which can be imaged to a substrate at the same resolution. Both are made possible by a significantly reduced Coulomb interaction in the beam. Furthermore, the moderate current density related to the projection optical system results in an enhanced process rate when precursor gases are used for beam-induced chemical processes. As compared with a focused beam system, also the beam intensity can be reduced considerably, thus an overly heating effect can be avoided.

When using ions as projectiles in a charged-particle optical system there is always the problem of beam impurities of the ion beams produced by conventional plasma ion sources such as a multicusp plasma source. Such beam impurities are of different mass and consequently different momentum and/or kinetic energy, typically in the range of few percent of the total beam, and will lead to image defects such as tails, double patterns or blurred patterns.

Mass impurities (i.e., impurities having same energy but different mass from the nominal beam ion species) may originate from, for example, residual gas in the multicusp ion source. Mass impurities will cause image defects in combination with unavoidable magnetic fields (typically in the range of 10 nT) which can not be shielded out sufficiently if varying external fields are present.

Particles with deviating energy are, for instance, particles ionized at a different potential than the nominal beam species. In the electro-optical arrangements used to project the particle beam, such energy-deviant particles will experience altered focal lengths and can, in consequence, cause underground dose or radial tails.

Well-known from prior art state of the art is the use of an E×B filter, a so-called Wien filter, or similar arrangements using a combination of electric and magnetic fields. In a Wien-type filter, a particle beam, preferably a beam of small diameter, is exposed to superposed electric and magnetic fields oriented in a manner that only particles of a defined beam energy and mass maintain their initial directions. The other particles are deflected out of the path and filtered out, usually by absorbing the deflected beam portion at a beam limiting aperture or slit diaphragm.

Disadvantages of the state-of-the-art Wien Filters are (i) the Coulomb interaction of the beam particles within the filter, causing an increased aberration and energy spreading in the subsequent electrooptical arrangements, and (ii) the destructive effect of the beam on the apertures (or slit plate) needed for absorbing unwanted beam portions, since it is usually unavoidable that rather high current densities occur. Moreover, the provision of a Wien-type filter increases the length of the optical column and involves additional mechanical and electrical complexity of the setup.

Apart from blurring of the image there is always the problem that ion irradiation may induce damage of beam-limiting elements of the optics, such as diaphragms or beam-shaping elements, where portions of the beam give rise to sputtering or undesired ion implantation. This problem is particularly problematic in connection with beam impurities, which have to be prevented by appropriate means, such as absorbing elements, from reaching the substrate.

SUMMARY OF THE INVENTION

One aspect of the invention is to overcome the above-stated deficiencies and modify a particle filter arrangement in a way to specifically select the desired particle species (the "nominal species") with reduced overall complexity and improved life time of the respective beam absorbing elements.

This may be obtained by means of an apparatus as set out at the beginning, wherein the illuminating optics system comprises a velocity-dependent deflector means adapted to form a deflecting field comprising a dipole electrical field transversal to the optical path and/or a dipole magnetic field transversal to the optical path, the deflecting field being adapted to act upon the particles, causing a deviation of the path of particles in the beamlets with regard to respective nominal paths, said deviation being dependent on the velocity of the particles, and wherein a delimiting means is provided as a component of the pattern definition means or the projection system, said delimiting means being adapted to remove particles whose paths are deviating from the nominal paths of the beamlets at the location of the delimiting means. In the context of this disclosure, a term like 'velocity-dependent' always means dependent upon the velocity of the actual beam particle (which may be a particle of the desired species or an impurity particle).

The invention allows a significant reduction of length of optical column and number of optical elements to be provided. This improvement reduces not only the complexity, but also reduces the susceptibility to disturbances due to external fields. The deflection imparted to the beam particles can be smaller as compared to state-of-the-art concepts. In consequence, it is possible to use much smaller field strengths in the deflector component as compared to state of the art apparatuses with comparable column length and beam energy. By virtue of the invention the drift length of the deflected particles to be selected out is significantly enhanced. Furthermore, the intensity of beam impurities at the position of the delimiting absorber plate used to stop those impurities is reduced by at least the void ratio of the PD device, typically to a few percent of the total intensity, thus enhancing the life time of the delimiting plate. This is particularly important if beams of heavy ions are used, which generally cause significant sputtering.

Another advantage of the invention is that the effect of Coulomb interaction is reduced as compared to the state of the art. This comes about since in the state of art devices, an additional crossover is needed in the illumination system and the particle beam energy in the Wien deflector is limited to comparatively low values in order to achieve the required mass and energy resolution. Previously, the particles at the position of the Wien deflector would typically have low energy (e.g. 5 keV) whereas the filter arrangement according to the invention, where the beam diameter is essentially small, can be operated at high energy (e.g. 20-100 keV).

Preferably, the illuminating optics system is configured to form an illuminating beam whose diameter is greater by at least one order of magnitude than the longitudinal extension of the PD means at the location where the beam is traversing it. In a preferred type of apparatus allowing high throughput, the PD means comprises a plurality of electrostatic beamlet deflectors, each of which is associated with a respective aperture of the PD means and is adapted to deflect the beamlet traversing the respective aperture by an amount dependent on an individual control signal, including an amount sufficient to deflect the beamlet off its nominal path.

Suitably the pattern definition means is positioned at or near the objective plane of the projection system so small deflections introduced at that location, e.g. because of the source related energy spreading, they do not result in a distortion of the image and thus can be tolerated.

In a preferred embodiment which enables a simple and yet efficient realization of the delimiting means, the latter is located in the vicinity of a cross-over formed in the projection system and comprises an absorber plate having an aperture surrounding the location of the cross-over, the shape and location of the aperture in the absorber plate being adapted in correspondence with the combined nominal paths of the beamlets, whereas particles propagating off the combined nominal paths impinge upon the aperture plate.

The velocity-specific deflector means may be located as the first component of the illuminating optics system, at a location where the beam emanating from the source has small lateral dimension so the deflector arrangement can be compact; the further components of the illuminating optics system are then, preferably, particle-optical lens elements.

The velocity-selective component that is located at a position before the pattern definition device will select particles with respect to their momentum and/or kinetic energy values. In one preferred embodiment, it is a E×B field arrangement of the Wien type (as used in a momentum analyzer). In general only one field component (E field or B field) would be sufficient in conjunction with an inflection of the optical axis in such a way that the center of the beam of nominal particles propagates along a nominal optical path. In order to obtain a straight path of the nominal species particles, the deflecting field comprises a combination of an electrical field and a magnetic field perpendicular to each other and perpendicular to the path of particles diverging from a source point in a bundle of radial directions. Preferably, the electric and magnetic fields may have field strengths chosen such that their deflecting effects are canceling each other for particles conforming to the nominal species.

Furthermore, it allows a substantial reduction of complexity if the delimiting means is located after the PD means, whereas the velocity-dependent deflector means located before the PD means is adapted to cause deviations that allow the beam particles to traverse the pattern definition means substantially unimpeded—even those that do not conform to the nominal species.

In the case that the beam traversing the deflector means is not parallel but divergent from, an advantageous embodiment is provided with a velocity-dependent deflector means that comprises a set of electrostatic electrodes and/or a set of magnetostatic electrodes, each of which has a planar surface oriented toward the beam, the plane of the planar surface oriented such that its geometric extension meets a virtual source point of the particle source.

An advantageous development of the invention uses more than one particle type for different purposes. Then, the particle source may generate a beam comprising a number of particle species, and the velocity-dependent deflector means may operate at a number of field configurations which correspond to a specific choice of one of said particle species as nominal species. For instance, a first particle species may be used for inspection and metrology purposes, and one or more second particle species for irradiating a target.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

In the following, the present invention is described in more detail with reference to the drawings:

FIG. 1 shows a schematic longitudinal section of a processing apparatus with a state-of-the-art particle filter arrangement;

FIG. 2 shows the working principle of a Wien-type deflector;

FIG. 3 shows a processing apparatus according to the invention, with a Wien-type deflector and the corresponding delimiting plate located after the PD device; dotted lines show trajectories for particles which represent a mass impurity;

FIG. 4 shows the processing apparatus of FIG. 3, with dotted lines showing trajectories for particles with an energy deviating from the nominal energy;

FIG. 5 shows a variant operating with an electrostatic deflector;

FIG. 6 shows another variant operating with a magnetostatic deflector;

FIGS. 7a-7c illustrate a field configuration for a Wien filter for a beam divergent from the origin of coordinates, with FIG. 7a depicting one exemplary shell of electric and magnetic field lines, FIG. 7b the magnetic field in the XZ plane and FIG. 7c the electric field in the XY plane; and FIGS. 8 and 9 show a setup principle of a "divergent multipole" a Wien filter realizing a field configuration corresponding to FIGS. 7a-c.

DETAILED DESCRIPTION OF THE INVENTION

The preferred embodiment of the invention discussed in the following is based on the PML2-type particle-beam exposure apparatus with a pattern definition (PD) system as disclosed in the U.S. Pat. No. 6,768,125 (=GB 2 389 454 A) of the applicant (assignee), and with a large-reduction projecting system. In the following, first the technical background of the apparatus is discussed as far as relevant to the invention, then embodiments of the invention are discussed in detail. It should be appreciated that the invention is not restricted to the following embodiments nor the PD system, which merely represent one of the possible implementations of the invention; rather, the invention is suitable for other types of processing systems that employ a particle-beam with projection stages as well.

PML2 System

A schematic overview of a maskless particle-beam processing apparatus PML2 employing the invention is shown in FIG. 1. In the following, only those details are given as needed to disclose the invention; for the sake of clarity, the components are not shown to size in FIG. 1, particularly the lateral width of the particle beam is exaggerated. For more details, the reader is referred to the U.S. Pat. No. 6,768,125 which is incorporated herein by reference.

As already mentioned, a particle beam generated by a particle source is used in the PML2 system. An illumination optical system forms the beam into a wide beam which illuminates a PD means having a regular array of apertures in order to define a beam pattern to be projected on a target surface. With each aperture, a small beam is defined, and the passage of each beam through an aperture can be controlled so as to allow ('switch on') or effectively deactivate ('switch off') the passage of particles of the beam through the respective apertures towards the target. The beam permeating the aperture array (or more exactly, through the switched-on apertures of the array) forms a patterned particle beam bearing a pattern information as represented by the spatial arrangement of the apertures. The patterned beam is then projected by means of a particle-optical projection system onto the target (for instance, a semiconductor substrate) where an image of the apertures is thus formed to modify the target at the irradiated portions. The image formed by the beam is moved along a straight path over each die field; additional scanning of the beam in a direction perpendicular to the scanning direction is not necessary (except, where needed, to compensate for lateral travel motion errors of the scanning stage).

The main components of the apparatus 100 are—in the order of the direction of the lithography beam lb, pb which in this example runs vertically downward in FIG. 1—an illumination system 101, a PD system 102, a projecting system 103, and a target station 104 with the target or substrate 14. The particle-optical systems 101, 103 are realized using electrostatic or electromagnetic lenses. The electro-optical parts 101,102,103 of the apparatus 100 are contained in a vacuum housing (not shown) held at high vacuum to ensure an unimpeded propagation of the beam lb, pb along the optical axis of the apparatus.

The illumination system 101 comprises, for instance, an ion source 11, an extractor arrangement 11a defining the location of the virtual source, a particle filter 12 and a illumination optics realized by a condenser lens system 13. The ions used can be, for instance, hydrogen ions or heavy ions; in the context of this disclosure heavy ions refer to ions of elements heavier than C, such as O, N, or the noble gases Ne, Ar, Kr, Xe. Apart from ions, the particles can be electrons (emitted from an electron gun) or, in general, other electrically charged particles can be used as well.

The ion source 11 emits energetic ions of primarily a certain species, such as $Ar^+$ ions having a defined (kinetic) energy of typically several keV (e.g. 5 keV at the PD system 102) with a comparatively small energy spread of, e.g., $\Delta E = 1$ eV; however, it is generally unavoidable that the source emits charged particles of other species as well. A velocity/energy dependent filter 12 serves to filter out such unwanted particle species; this filter is further discussed below. By means of an electro-optical condenser lens system 13, the ions emitted from the source 11 are formed into a wide-area, substantially telecentric ion beam serving as lithography beam lb. The telecentricity of the beam is within a range of ±25 grad deviation from the optical axis at the position of the PD device, resulting in a telecentricity range of ±5 mrad deviation from the optical axis at the position of the substrate, assuming here a 200× reduction system and equal particle energies at PD device and substrate.

The lithography beam lb then irradiates a PD device which, together with the devices needed to keep its position, form the PD system 102. The PD device is held at a specific position in the path of the lithography beam lb, which thus irradiates an aperture pattern formed by a plurality of apertures 21. As already mentioned, each of the apertures can be "switched on" or "open" so as to allow the beamlet passing through the respective aperture to reach the target (it is then said, the aperture is transparent to the incident beam); otherwise, the aperture is "switched off" or "closed", in which case the beam path of the respective beamlet is affected in a way that it will be absorbed or otherwise removed out of the beam path before it can reach the target (thus, the aperture is effectively non-transparent or opaque to the beam). The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). For details about the architecture and operation of the PD device, and in particular the architecture of its blanking plate, the reader is referred to the U.S. Pat. No. 6,768,125. In FIG. 1 only five beamlets are shown in the patterned beam pb, of which the second beamlet from the left is switched off as it is absorbed on an absorbing plate 17; the other, switched-on beamlets pass through a central opening of the plate 17 and thus are projected onto the target.

The pattern as represented by the patterned beam pb is then projected by means of an electro-optical projection system 103 onto the substrate 14 where it forms an image of the switched-on mask apertures. The projection system 103 implements a demagnification of, for instance, 200×. The substrate 14 is, for instance, a silicon wafer covered with a photo-resist layer. The wafer 14 is held and positioned by a wafer stage (not shown) of the target station 104.

In the embodiment of the invention shown in FIG. 1, the projection system 103 is composed of two consecutive electro-optical projector stages with a crossover c1, c2, respectively. The electrostatic lenses 30 used to realize the projectors are shown in FIG. 1 in symbolic form only as technical realizations of electrostatic imaging systems are well known in the prior art, such as, for instance, the U.S. Pat. No. 4,985,634 (=EP 0 344 646) of the applicant. The first projector stage images the plane of the apertures of the PD device to an intermediate image which in turn is imaged onto the substrate surface by means of the second projector stage. Both stages employ a demagnifying imaging through cross-overs c1,c2; thus, while the intermediate image is inverted, the final image produced on the substrate is upright (non-inverted). The demagnification factor is about 14× for both stages, resulting in an overall demagnification of 200×. A demagnification of this order is in particular suitable with a lithography setup, in order to elevate problems of miniaturization in the PD device.

As a means to introduce a small lateral shift to the image, i.e. along a direction perpendicular to the optical axis cx by an amount not larger than the lateral width of the beam bp itself, deflection means (not shown) may be provided in one or both of the projector stages. Such deflection means can be realized as, for instance, a multipole electrode system; as discussed in the U.S. Pat. No. 6,768,125; additionally, a magnetic coil may be used to generate a rotation of the pattern in the substrate plane where needed. The electrooptical lenses are mainly composed of electrostatic electrodes, but magnetic lenses may also be used.

By controlling the pattern formed in the PD system 102, an arbitrary beam pattern can be generated and transferred to a substrate. Suitably, a scanning stripe exposure strategy, where the substrate is moved under the incident beam, is utilized so a beam-scanning strategy is not required, where the position of the beam is perpetually changed and thus the beam is effectively scanned over the (more or less resting) target surface like in case of a single focused beam system.

Wien Filter (State of the Art)

As already mentioned, the particle-beam processing apparatus 100 comprises a particle filter to remove unwanted particle species from the beam lb. The most usual type of such a filter is a Wien-type filter which is primarily dependent on the particle velocity as well as the specific charge as discussed in detail below. A "standard" Wien filter, schematically depicted in FIG. 2, comprises a Wien deflector 22 and a delimiting aperture 25. The Wien deflector 22 is realized by a magnetostatic field B and an electrostatic field E which (taking into account that these two fields are vector fields) are perpendicular to each other throughout the space of interest and, at the same time, are both perpendicular to the velocity vector $S=v \cdot e_z$ of the particles of the beam that are to be selected (the nominal particles). Here, it is assumed that the optical axis of the beam is along the z axis, as is usual in connection with lithography and processing apparatus.

In the simple case depicted in FIG. 2, a homogeneous electrostatic field E is produced by a parallel charged plates of a length L, and a homogeneous magnetic field B is produced by an appropriate magnetostatic circuit (not shown in FIG. 2; in FIG. 2, the magnetic field is perpendicular to the paper plane) of same length. The angular deflection $\Delta\phi$ of the beam is $$\Delta\phi = \Delta v/v = (F/m) \cdot \Delta t/v = (e/m)(E+vB) \cdot (L/v^2)$$

taking into account that the change in velocity, $\Delta v$, is perpendicular to the direction of velocity v (which is assumed to be much greater than $\Delta v$, so $\Delta\phi$ is small). Newton's law $F=m\Delta v/\Delta t$ is used, where $\Delta t=L/v$ is the time a particle needs to pass the plate arrangement, as well as the extended Coulomb's law $F=e(E+vB)$ (here, the scalar version can be used since the vector quantities are oriented properly). This can be rearranged to read $$\Delta\phi = (e/m)L(E/v^2+B/v).$$

This relation demonstrates that, given a fixed deflector device, the deflection depends on two properties of the particle species in question: (i) the velocity v and (ii) the specific charge e/m. This observation applies to deflectors having only an electric fields or a magnetic field as well, and even to deflectors with non-perpendicular arrangement of the electromagnetic fields. By virtue of the velocity dependence of particle momentum (mv) and kinetic energy ($mv^2/2$), the velocity-dependent filter can also be seen as an momentum/energy dependent filter.

Whenever the particle beam contains particle species of different characteristics as defined by velocity or momentum/kinetic energy, the deflector will split the beam into directions according to their corresponding deflection values, thus analyzing the beam. Therefore, the deflector 22 may also be called analyzing means. After the deflector 22, a delimiting aperture plate 25 is provided which stops all particles except those traversing the aperture in the plate 25. Thus, particles are delimited to a defined range of deviation $\Delta\phi$.

If particles of a certain velocity value $v_0$ are to be filtered out, a very usual approach is to choose field strengths E, B which obey the relation $E=v_0B$ (omitting the negative sign). Then the effect of the fields on the particles having velocity $v_0$ will cancel exactly. Particles having that velocity will traverse the filter without a change of the trajectory while other particles will be deflected; the deflection being the greater the more their actual velocity v departs from the nominal value $v_0$. Those particles will, therefore, deviate from the path of particles having the nominal velocity (and nominal specific charge) which allows to stop them by elements delimiting the beam path laterally such as an aperture plate 25.

Referring again to FIG. 1, the state of the art E×B momentum filter arrangement combines a momentum selective deflector 12 with a focusing element, such as the first lens of the illumation optics, and an aperture plate 15 before the pattern definition device 102. By arranging the deflector component 12 and the delimiting component 15 close together, the filtering effect strongly depends on the achievable strength of the selective fields, and is generally reduced with increased ion mass.

Separated Wien Filter

FIG. 3 shows a schematic depiction of a maskless particle-beam processing apparatus 300 with a Wien-type filter arrangement according to the invention. In contrast to the apparatus 100 of FIG. 1, no delimiting aperture plate is present between the velocity-dependent deflector 32 and the PD device 102. In the deflector 32 the particles will be analyzed with respect to velocity and specific charge, which will result in a momentum/energy dependent deflection, and then propagate through the PD device 102 and the projection system 103 until they reach one of the crossovers, in this case the second crossover c2. Only at the position of the crossover c2 the deviating particles will be blocked off by the absorbing plate 37 which serves as delimiting component according to the invention.

To illustrate this, the dotted lines in FIG. 3 indicate trajectories of particles with deviating mass of a certain type but having the same kinetic energy as the nominal particles (whose trajectories are shown as full lines). In contrast to the latter, the particles with deviating mass are stopped at the absorbing plate 37 located between the PD device 102 and the target 14.

A like case, namely, particles with deviating kinetic energy (but having same mass and charge) is shown in FIG. 4. As a consequence of the different energy, the beamlets of "wrong" kinetic energy, whose trajectories are shown as dotted lines again, form focus locations distinctly dislocated along the z axis. Due to the Wien deflector, they are also displaced laterally. Therefore, the majority of those beamlets are stopped at the absorber plate 37; only a negligible part passes the plate 37 and reaches the substrate 14 as a highly defocused beam. The latter gives rise to a small background dose which can be tolerated or corrected for using a dose correction procedure, employing a method analogous to the known "fogging correction" or proximity correction in electron beam direct write technology.

The setup shown in FIGS. 3 and 4 disposes with one crossover in the illumination path of the beam. As a consequence, the invention brings about a significant reduction of length of optical column, and the number of lenses is reduced. Moreover, the absorbing plate 37 has a double function: it not only blocks out the switched-off beamlets (by the same working scheme as the one shown in FIG. 1) but also serves to remove particles not conforming with the nominal particle species (FIGS. 3 and 4), such as contaminant gases. Therefore, also the number of absorbing elements is reduced as compared to the prior-art setup shown in FIG. 1. Overall, the invention allows to reduce the complexity of the apparatus distinctly.

Advantageously, the absorbing plate 37 is realized with a material exhibiting a slow erosion rate under the impact of the particle beam. A suitable material is non-insulating in order to avoid charging effects. Furthermore, a positive potential may be applied to the absorbing plate 37 so as to prevent the emission of secondary electrons.

It will be of great advantage if the delimiting absorbing plate is realized as a part that can be replaced easily (consumable part). Furthermore, it is possible to arrange for different plates having different characteristics such as material or surface structure, which is suitably chosen with regard to the actual ion species to be used. Thus, the operation mode can be switched, employing ions with different masses: a light mass for deposition or imaging, a heavy mass for sputtering and etching.

The presented apparatus realizes an optical scheme capable of direct patterning with ions that comprises an ion source, a mass and/or energy selective deflector, a condenser system capable to produce a highly parallel beam, a PD device configured to be addressed by an external computer means to deflect individual beams, and a large-reduction projection optics with at least one absorbing plate (stopping or delimiting plate) capable to stop individual beams generated and deflected by the pattern definition device. A large reduction factor, such as a factor of 200×, has the advantage that the aperture plate of the pattern definition device, whose task is the shaping of the parallel and homogeneous beam into an array of beams, will be exposed to beam current densities substantially smaller than the final current densities at the substrate; in the example by a factor of 40,000. Therefore, the large reduction factor allows practicable cycle times for the lifetime limited parts of the pattern definition device, also in a production process with realistic throughput. Besides, it allows the use of MEMS structured plates as components of the pattern definition device with feature sizes of few micrometers for nanostructures (e.g. 3 µm apertures for 15 nm geometric spot size) and easily replaceable plates by implementing a mounting/demounting arrangement of plates.

By using a momentum/energy selective component at a position before the PD device, and a corresponding delimiting component after the PD device, a filtering of beam particles is achieved which allows the (unfiltered) spectrum of particles traverse the PD device. The PD device is realized, for instance, as a stack of several plates comprising at least an aperture plate (beam limiting) and a deflector array (blanking plate), as further explained in U.S. Pat. No. 6,768,125. The extension of the PD device along the beam direction is small enough, and the actual deflections of the beam impurities are sufficiently slight, so the beam will not touch or affect any component inside the PD device even for beam constituents entering it at a slightly deflected angle. The typical deflection angle necessary to filter beam particles and eventually stop them at the absorbing plate is very small, typically in the range of 0.25 to 1.0 mrad. The small threshold angle for filtering is made possible by the large distance between deflector and absorbing plate.

It is worthwhile to mention that the position of the PD device is suitably chosen to be at or near the objective plane of the projection optics. This is of particular importance as then any angular spread of the nominal particles (the particle source has always some energy spreading, typically 0.1-5 eV, depending on the source technology) does not, in first order, involve imaging errors in form of blurring or displacement. With the PD device at or near the objective plane (of the projection system) the momentum/energy selective component does only lead to a minor increase of the numerical aperture NA (local divergence angle) at the PD device for the nominal mass particles (assuming 20 keV beam energy and 5 eV (FWHM=full width half maximum) energy spreading, the increase of the NA is typically smaller than ±1 µrad).

In a variant of the invention, the deflector element may have only a transversal electric field or a transversal magnetic field, as shown in FIGS. 5 and 6, respectively. In this case, there is no canceling of deflection effects for the nominal species of particles; rather, they will be deflected as well by a certain amount, and other species by an amount greater or smaller. Therefore, the path of the beam is bent, and rather than a straight optical axis, the beam propagates along an optical path which is curved through the deflector. The same is true in a combined electromagnetic deflector where the electric and magnetic fields are not matched according to the above relation.

The setup depicted in FIG. 5 employs an electrostatic deflector element 52 by which all particles are deflected, the amount of deflection depending on the particle kinetic energy. The dotted lines indicate, as an example, trajectories of particles with deviating (reduced) energy, which are stopped at the absorber plate 37 to a large extent, only a very small fraction reaching the substrate as a highly defocused beam.

In the variant apparatus shown in FIG. 6, a magnetic deflector element 62 is provided which deflects all particles in a manner depending on the particle momentum. In FIG. 6, the magnetic field runs perpendicular to the paper plane; the magnetic circuit to produce that field is not shown for the sake of clarity. The dotted lines indicate, as an example, trajectories of particles with deviating (greater) mass but having same energy, which are stopped at the absorber plate 37.

In all variants, angular distortions of the filtered beam due to stray fields can be corrected by multipole fields (quadrupole, hexapole) not explicitly shown in the figures. In a preferred variant one multipole with 12 individual electrodes may be used to form the dipole field for filtering and, at the same time, the hexapole field for correcting the stray fields.

Wien Deflector for a Divergent Particle Beam

As already mentioned, in the usual particle-beam processing apparatus the particle beam is divergent from a point-like virtual source. Therefore, a review of the simple deflector setup over that of FIG. 2 may offer an improvement of performance. In the following discussion, the coordinate system is chosen such that the source point is at the origin of the coordinate system; if there is a main direction of the particle beam emanating from the source, the z axis is chosen to coincide with that direction. Then, the velocity vectors of the particles can all be described by $S=v \cdot [x,y,z]/r$, wherein r is the distance of the point form the origin ($r^2=x^2+y^2+z^2$). (Here square brackets are used to denote vector quantities by their components according to Cartesian coordinates.)

The electromagnetic field configuration will be more general than in the simple example of FIG. 2. The orientational conditions of the vector quantities are that the vectors $E=[E_x, E_y, E_z]$, $B=[B_x, B_y, B_z]$, and velocity $S=[S_x, S_y, S_z]$ are mutually perpendicular. These conditions and the relation $|v|=|E|/|B|$ fix four of the six degrees of freedom of the electric and magnetic fields. The remaining two degrees of freedom can be chosen suitably. One choice, which allows to obtain a magnetic field configuration that is easy to realize technically, is $B_x=y/(x^2+y^2)$, $B_y=-x/(x^2+y^2)$. This choice leads to a field configuration where the magnetic field corresponds to that of a conductor line bearing a current along the y axis. The complete components are $$E=(A/vr)[-xz/(x^2+y^2),-yz/(x^2+y^2),1], B=A[y/(x^2+y^2),-x/(x^2+y^2),0]$$

with A an appropriate constant defining the absolute value of the fields.

The electric and magnetic field lines of this configuration can be viewed as spanning, on each sphere around the origin of coordinates, a net bearing a resemblance to the lines of longitude and latitude of a globe, respectively. The magnetic field lines are circles running around the y axis (the embedding plane of each circle being parallel to the xz plane), whereas the electric field lines are (semi)circular lines, each running in a plane through the y axis. A portion of one such sphere of field lines is illustrated in FIG. 7a; only a portion is needed since the technical implementation requires only a limited solid angle to subtend the particle beam. A good approximation of an electric field of this type is a field generated by an electric equipotential surface formed as a double cone 7e1,7e2 whose apex is in the source point, with applying a positive electric potential to one single cone and the opposite (negative) electric potential to the other single cone of the double cone. The magnetic field can be sufficiently approximated by the magnetic field generated between two planar magnetostatic electrodes 7m1,7m2 oriented such that they (literally or when prolongated geometrically) intersect along the y axis. Examples of a field configurations, namely, the magnetic field in the xz plane and the electric field in the xy plane, are illustrated in FIGS. 7b and 7c, respectively; possible arrangements of the electrodes 7e1, 7e2, 7m1, 7m2 are shown as well.

In order to realize a field configuration for a divergent beam, the invention exploits a method analogous to using multipole arrangements to generate homogenous fields, namely, to use multipole rods which are oriented in the direction of potential lines (and consequentially, along the beam direction) and applied the appropriate electric potential. Thus, rod-shaped electric and/or magnetic field electrodes are used along a suitable surrounding shape (such as a double cone) around the divergent beam and appropriate electrostatic or magnetostatic potentials (i.e., voltages or magnetizations) are applied which approximate the desired field sufficiently. In this case, owing to the special magnetic field configuration, it is sufficient to use to magnetic electrodes oriented such as to enclose an angle while a multiple-like electrode arrangement is used only to generate the electric field. This special electrode configuration is here referred to as the "divergent multipole". The imaginary prolongation of the magnetic field electrode surfaces intersect at the location of the virtual source point; the same is valid for the imaginary prolongation of the surfaces of the electric multipole electrodes.

FIGS. 8 and 9 show an embodiment of a divergent multipole setup, in a longitudinal section and a view on the exit opening, respectively. The horizontal axis in FIG. 8 is the optical axis, coinciding with the z axis of the field configuration. The magnetic field is illustrated by dashed lines; the electric field, by dotted lines. In this setup, eight electrostatic electrodes 81 are provided to form an octupole arrangement; the electrodes have an overall shape resembling a pyramid frustum with removed top and bottom base, the beam 80 entering through the "top" side and exiting at the "bottom" side. Thus, the radius of the opening starts from an initial radius R1 which increases to a final radius R2. The electrodes encompass an opening angle $\alpha 1$ which is a few times greater than the opening angle $\alpha 0$ of the beam 80. The electrodes 81 are surrounded by two magnet electrodes 82 located at opposite sides. The electrodes 82 enclose an opening angle $\alpha 2$ and are part of a magnetostatic circuit which is symbolically depicted in FIG. 9. The electric supplies for the electrodes—voltage supplies for the electrodes 81; current supplies for the magnet circuit feeding the electrodes 82—are not shown in FIGS. 8 and 9 for the sake of clarity. The respective lengths L1, L2 (as projected onto the z axis) of the electric and magnetic electrodes should preferably be about equal to each other.

By imposing higher orders of multipole fields on the beam 80 using the multipole electrodes 81, it is possible to compensate for angular aberrations caused in the diverging beam.

According to another aspect of the invention, a particle source may be used emitting more than one species of particles (for example, a multi-cusp source fed with a mixture of feeding gases), and one of those particles species is selected by a suitable choice of selective fields. By changing the selective fields it is thus possible to switch between different ion types as nominal species in an easy and fast way. The different ion species may be used for different structuring processes and/or for different operation steps. As one of the possible applications, a light ion such as $He^+$ may be used for inspection and metrology, heavy ions such as Ar for the actual patterning (processing) of a target.

In a further aspect of the invention, a beam impurity may be used intentionally for the measurement of beam alignment in the ion-optical column ("beam lock") by detection of deflected beam components. For instance, this could be done by detection of the deflected beam component with spatial resolution using a knife edge. Another approach is to change the energy of the particles for a short time, e.g. by varying the extraction voltage in the range of ±100 eV only for the duration of the alignment measurement.

While preferred embodiments of the invention have been shown and described herein, it will be understood that such embodiments are provided by way of example only. Numerous variations, changes and substitution will occur to those skilled in the art without departing from the spirit of the invention. Accordingly, it is intended that the appended claims cover all such variations as fall within the spirit and scope of the invention.

I claim:

1. A particle-beam apparatus for irradiating a target, comprising a particle source adapted to generate a beam of energetic electrically charged particles the majority of which conform to a nominal species of a nominal mass having a nominal kinetic energy, an illumination optics system for forming said beam into an illuminating beam which is substantially tele/homocentric along an optical path, a pattern definition means located after the illumination optics system as seen along the direction of the beam, said pattern definition means comprising a plurality of apertures, said apertures being adapted to form the illuminating beam into a plurality of beamlets, a projection system configured to form the beamlets emerging from the pattern definition means into a final image of the apertures, and a target stage means adapted to position a target at the position of said final image, wherein the illuminating optics system comprises a velocity-dependent deflector means adapted to form a deflecting field comprising at least one of an dipole electrical field transversal to the optical path and a dipole magnetic field transversal to the optical path, the deflecting field being adapted to act upon the particles, causing a deviation of the path of particles in the beamlets with regard to respective nominal paths, said deviation being dependent on the velocity of the particles, wherein a delimiting means is provided as a component of one of the pattern definition means and projection system, said delimiting means being adapted to remove particles whose paths are deviating from the nominal paths of the beamlets at the location of the delimiting means, and wherein the velocity-dependent deflector means comprises a set of electrostatic electrodes and/or a set of magnetostatic electrodes, each of said electrodes having a planar surface oriented toward the beam, wherein its geometric extension meets a virtual source point of the particle source.

2. The apparatus of claim 1, wherein the pattern definition means comprises a plurality of electrostatic beamlet deflectors, each of which is associated with a respective aperture of the pattern definition means and is adapted to deflect the beamlet traversing the respective aperture individually by an amount sufficient to deflect the beamlet off its nominal path.

3. The apparatus of claim 1, wherein the pattern definition means is positioned at or near an objective plane of the projection system.

4. The apparatus of claim 1, wherein the delimiting means is located in the vicinity of a cross-over formed in the projection system and comprises an absorber plate having an aperture surrounding the location of the cross-over, the shape and location of the aperture in the absorber plate being adapted in correspondence with the combined nominal paths of the beamlets, whereas particles propagating off the combined nominal paths impinge upon the aperture plate.

5. A particle-beam apparatus for irradiating a target, comprising
a particle source adapted to generate a beam of energetic electrically charged particles the majority of which conform to a nominal species of a nominal mass having a nominal kinetic energy,
an illumination optics system for forming said beam into an illuminating beam which is substantially tele/homocentric along an optical path,
a pattern definition means located after the illumination optics system as seen along the direction of the beam, said pattern definition means comprising a plurality of apertures, said apertures being adapted to form the illuminating beam into a plurality of beamlets,
a projection system configured to form the beamlets emerging from the pattern definition means into a final image of the apertures, and
a target stage means adapted to position a target at the position of said final image,
wherein the illuminating optics system comprises a velocity-dependent deflector means adapted to form a deflecting field comprising at least one of an dipole electrical field transversal to the optical path and a dipole magnetic field transversal to the optical path, the deflecting field being adapted to act upon the particles, causing a deviation of the path of particles in the beamlets with regard to respective nominal paths, said deviation being dependent on the velocity of the particles,
wherein a delimiting means is provided as a component of one of the pattern definition means and projection system, said delimiting means being adapted to remove particles whose paths are deviating from the nominal paths of the beamlets at the location of the delimiting means, and
wherein the velocity-specific deflector means is located as the first component of the illuminating optics system, the further components of the illuminating optics system being particle-optical lens elements.

6. The apparatus of claim 1, wherein the deflecting field comprises a combination of an electrical field and a magnetic field perpendicular to each other and perpendicular to the path of particles diverging from a source point in a bundle of radial directions.

7. The apparatus of claim 6, wherein the electric and magnetic fields have field strengths chosen such that their deflecting effects are canceling each other for particles conforming to the nominal species.

8. The apparatus of claim 1, wherein the delimiting means is located after the pattern definition means, the velocity-dependent deflector means being adapted to cause deviations that allow the beam particles to traverse the pattern definition means substantially unimpeded.

9. A particle-beam apparatus for irradiating a target, comprising
a particle source adapted to generate a beam of energetic electrically charged particles the majority of which conform to a nominal species of a nominal mass having a nominal kinetic energy,
an illumination optics system for forming said beam into an illuminating beam which is substantially tele/homocentric along an optical path,
a pattern definition means located after the illumination optics system as seen along the direction of the beam, said pattern definition means comprising a plurality of apertures, said apertures being adapted to form the illuminating beam into a plurality of beamlets,
a projection system configured to form the beamlets emerging from the pattern definition means into a final image of the apertures, and
a target stage means adapted to position a target at the position of said final image,
wherein the illuminating optics system comprises a velocity-dependent deflector means adapted to form a deflecting field comprising at least one of an dipole electrical field transversal to the optical path and a dipole magnetic field transversal to the optical path, the deflecting field being adapted to act upon the particles, causing a deviation of the path of particles in the beamlets with regard to respective nominal paths, said deviation being dependent on the velocity of the particles,
wherein a delimiting means is provided as a component of one of the pattern definition means and projection system, said delimiting means being adapted to remove particles whose paths are deviating from the nominal paths of the beamlets at the location of the delimiting means,
wherein the particle source is adapted to generate a beam comprising a number of particle species, and the velocity-dependent deflector means is configured to operate at a number of field configurations which correspond to a specific choice of one of said particle species as nominal species, and
wherein the apparatus is further adapted to use a first particle species for inspection and metrology purposes, and a second particle species for irradiating a target.

* * * * *